United States Patent [19]

Ou et al.

[11] Patent Number: 4,899,070

[45] Date of Patent: Feb. 6, 1990

[54] BIT LINE SENSE AMPLIFIER FOR PROGRAMMABLE LOGIC DEVICES

[75] Inventors: Jung-Hsing Ou, San Jose; Sau-Ching Wong, Hillsborough, both of Calif.

[73] Assignee: Altera Corporation, Santa Clara, Calif.

[21] Appl. No.: 218,556

[22] Filed: Jul. 13, 1988

[51] Int. Cl.[4] .................... H03K 3/353; H03K 17/26; H03K 17/28; G11C 7/02

[52] U.S. Cl. ..................... 307/530; 307/468; 307/482; 307/362; 307/279; 365/196; 365/208; 365/104

[58] Field of Search ............... 307/530, 279, 354, 270, 307/571, 581, 584, 483, 468, 362; 365/103, 104, 195, 196, 208

[56] References Cited

U.S. PATENT DOCUMENTS

| | | | |
|---|---|---|---|
| 3,566,153 | 2/1971 | Spencer | 307/205 |
| 4,124,899 | 11/1978 | Birkner et al. | 364/716 |
| 4,609,986 | 9/1986 | Hartmann et al. | 364/200 |
| 4,617,479 | 10/1986 | Hartmann et al. | 307/465 |
| 4,677,318 | 6/1987 | Veenstra | 307/465 |
| 4,701,644 | 10/1987 | Campione | 307/530 |
| 4,703,206 | 10/1987 | Cavlan | 307/465 |
| 4,713,792 | 12/1987 | Hartmann et al. | 364/900 |
| 4,719,600 | 1/1988 | Huffman et al. | 307/530 X |
| 4,748,349 | 5/1988 | McAlexander, III et al. | 307/530 |
| 4,761,571 | 8/1988 | Golke et al. | 307/530 X |
| 4,769,564 | 9/1988 | Garde | 307/530 |

*Primary Examiner*—Stanley D. Miller
*Assistant Examiner*—David R. Bertelson
*Attorney, Agent, or Firm*—Robert R. Jackson

[57] ABSTRACT

In a programmable logic device, switching speed is improved by preventing the bit line potential from going excessively close to ground even when large numbers of word line connections to the ground conductor are made. In addition, bit line pull up to logic 1 is effected more rapidly (without retarding bit line pull down to logic 0) by having two transistors connected in parallel with one another between the reference potential source and the bit line. One of these transistors is on all the time providing a relatively small leakage current. The other transistor is on only while the bit line is at logic 0, thereby speeding pull up to logic 1 and then shutting off so as not to impede subsequent return to logic 0.

12 Claims, 2 Drawing Sheets

4,899,070

BIT LINE SENSE AMPLIFIER FOR PROGRAMMABLE LOGIC DEVICES

BACKGROUND OF THE INVENTION

This invention relates to programmable logic devices ("PLDs"), and more particularly to improved bit line sense amplifiers for PLDs.

Programmable logic devices ("PLDs") are well known as shown, for example, by such references as Hartmann et al. U.S. Pat. Nos. 4,617,479; Hartmann et al. 4,609,986; Veenstra 4,677,318; Hartmann et al. 4,713,792; Birkner et al. 4,124,899; Cavlan 4,703,206; and Spencer 3,566,153, all of which are hereby incorporated by reference herein. There is a continuing demand for PLDs which are both larger and faster. However, these two objectives conflict with one another because as the number of interconnected devices increases (in order to provide larger PLDs capable of performing more complex logic functions), circuit loading and propagation delay also tend to increase, thereby tending to decrease the switching sped of the PLD.

In view of the foregoing it is an object of this invention to provide improved circuits for PLDs which increase the switching speed of the PLD (e.g., by counteracting the effects of increased circuit loading).

It is a more particular object of this invention to provide improved bit line sense amplifier circuits for PLDs (e.g., bit line sense amplifier circuits which are capable of faster switching speeds).

SUMMARY OF THE INVENTION

These and other objects of the invention are accomplished in accordance with the principles of the invention by providing a variable current limiting device (e.g., a transistor) in the circuit connecting each bit line array to ground. This variable current limiting device is controlled by a feedback signal from the bit line output so that when the bit line tends to go excessively low (e.g., because a large number of the electrically programmable read-only memory devices ("EPROMs") in that bit line array are turned on), the variable current limiting device becomes less conductive, thereby preventing the bit line output from going unnecessarily close to ground. Without the improvement of this invention, the bit line output signal could go very close to ground, thereby increasing the time required to pull it back up to logic 1 when all the associated EPROMs turn off.

Another feature of the invention also helps increase the speed at which the bit line output can be pulled up from logic 0 to logic 1. The pull-up function is performed by two pull-up transistors connected in parallel with one another between the source of relatively high reference potential (VCC) and the amplified bit line output. One of these pull-up transistors (which is preferably relatively small and which therefore provides only a relatively small "leakage" current) is controlled so that it is on at all times. The other pull-up transistor (which is preferably relatively large and therefore provides a relatively large current when it is on) is controlled so that it shuts off as soon as the bit line output switches to logic 1. Accordingly, this second pull-up transistor helps to rapidly pull up the bit line output during a transition from logic 0 to logic 1, but it does not subsequently slow down a transition from logic 1 to logic 0.

Further features of the invention, its nature and various advantages will be more apparent from the accompanying drawings and the following detailed description of the preferred embodiments.

DETAILED DESCRIPTION OF THE PREFERRED EMBODIMENTS

Figure 1:
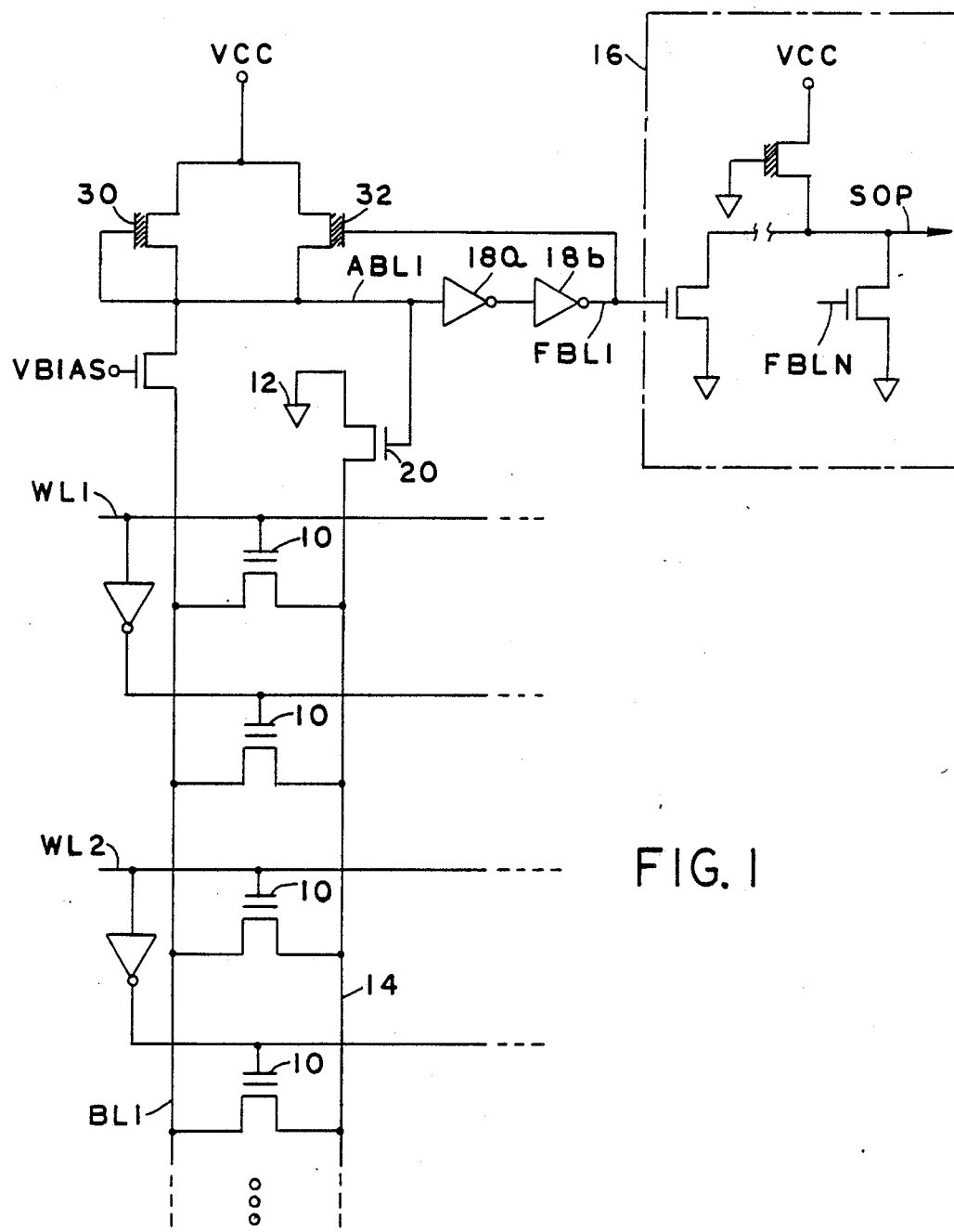
FIG. 1 is a schematic diagram of an illustrative embodiment of the invention.

FIG. 1 shows part of the conventional circuitry for a PLD which has been modified in accordance with the principles of this invention. EPROMs 10 are programmable interconnections between each of a plurality of input word lines WL1, WL2, etc., and each of a plurality of bit lines BL1, BL2, etc. (only one of which is shown in FIG. 1). As is usual (although not always necessary), both the true and complement versions of each word line signal are connectable to each bit line.

EPROMs 10 are individually programmed in advance so that each EPROM either does or does not apply the associated work line signal (true or complement) to the associated bit line. For example if a particular EPROM 10 is programmed to apply associated (true or complement) word line signal to the associated, bit line, then when that (true or complement) word line signal is logic 1, the EPROM connects the bit line to "ground" (logic 0) at point 12 via the "virtual" ground line 14 and current limiting device 20 associated with that bit line. This causes the bit line to go low (logic 0), which in turn causes the amplified bit line signal (e.g., ABL1) and the final bit line signal (e.g., FBL1) to also go low. Typically (although not necessarily) several final bit line signals are combined in additional logic circuitry 16 to provide a sum-of-products output signal SOP which may be either output from the PLD or further processed in the PLD.

Typical voltages in the circuit are as follows: VCC is 5 volts; VBIAs is approximately 2.5 volts; ground (e.g., point 12) is 0 volts; logic 0 on BL1 is typically less than 1 volt; logic 1 on BL1 is typically greater than 1 volt; logic 0 on ABL1 is approximately 1.2 volts; logic 1 on ABL1 is 3 to 3.5 volts; logic 0 on FBL1 is approximately 0 volts; and logic 1 on FBL1 is approximately 5 volts. Thus inverters 18a and 18b collectively comprise a circuit for sensing the potential difference between the logical states of the ABL1 signal and for amplifying that signal to the normal CMOS (complementary metal oxide semiconductor) levels of 0 and 5 volts. It will be understood that the particular voltages mentioned above are merely illustrative, and that they are provided solely as an aid to understanding the depicted circuit. Those skilled in the art will appreciate that any or all of these voltages can be altered, even to the point of reversing polarities, without departing from the scope and spirit of the invention. For example, although "ground potential" is referred to herein and in the appended claims, it will be understood that this is merely an arbitrary term and that it is not used in any absolute sense. Thus the potential referred to as "ground potential" could be any potential different from (i.e., higher or lower than) VCC.

Although only a small number of word lines are shown connectable to bit line BL1 in FIG. 1, it is not at all unusual in current PLD designs for there to be 100 or more word lines connectable to each bit line. Similarly, although one one bit line BL1 is shown in FIG. 1, it is not at all unusual for there to be 100 or more bit lines connectable to each word line.

Figure 2:
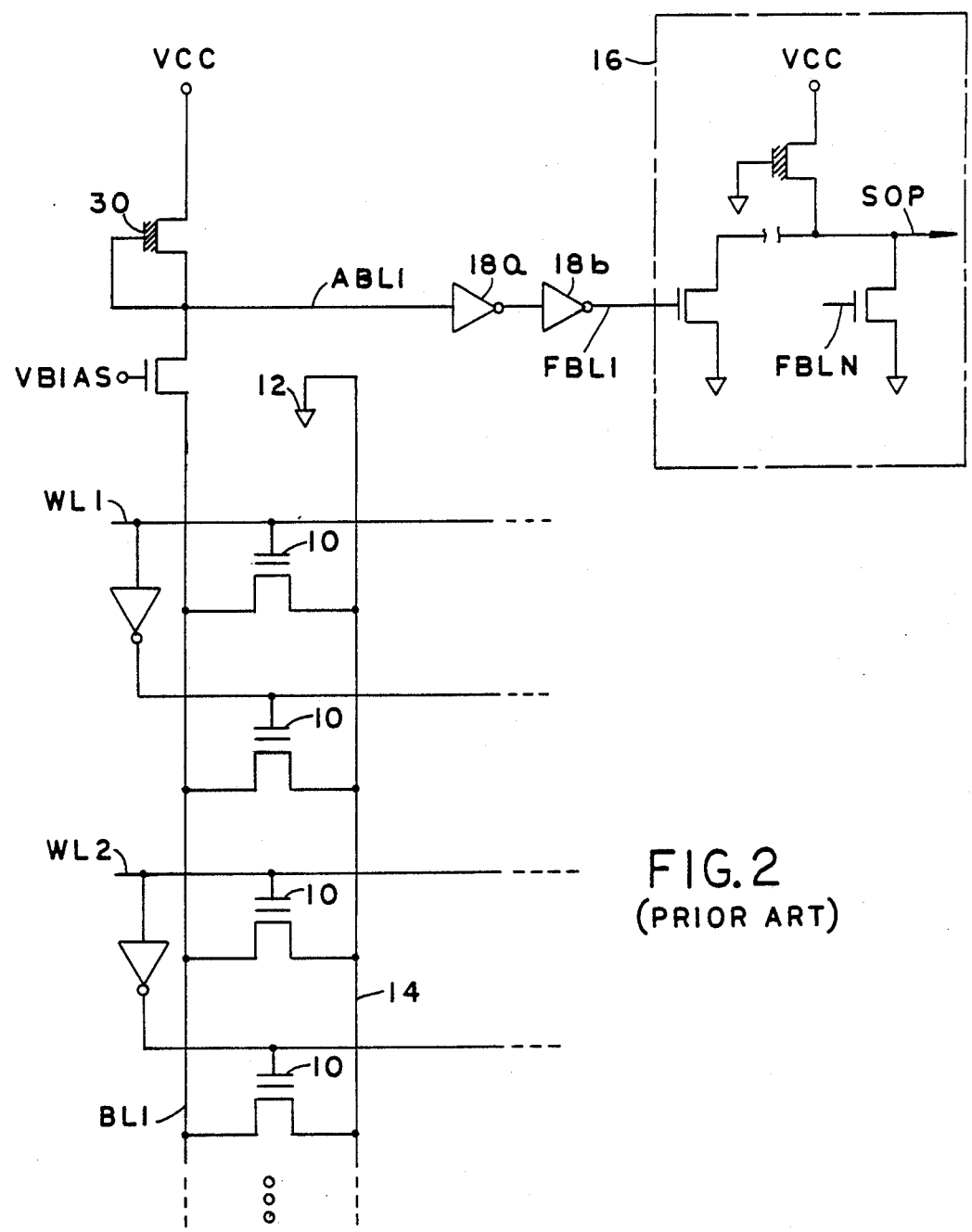
FIG. 2 is a schematic diagram of a prior art circuit of the general type shown in FIG. 1, but without the features of the present invention.

When only a relatively small number of the EPROMs connected to bit line BL1 are turned on, the voltage on BL1, although logic 0, may remain relatively high (e.g., typically less than but relatively close to 1 volt). Thereafter, when all of these EPROMs are turned off, the voltage on BL1 can be pulled up to logic 1 relatively quickly. However, when a relatively large number of the EPROMs connected to bit line BL1 are turned on in the absence of this invention (as in the case of the prior art circuit shown in FIG. 2), the voltage on BL1 tends to go very close to ground (e.g., very close to 0 volts). This means that it takes substantially longer to pull the voltage on BL1 up to logic 1 when all of the EPROMs turn off. This data pattern is normally the "worst case" for the transition of BL1 from logic 0 to logic 1.

In accordance with the present invention as shown in FIG. 1, current limiting transistor 20 is connected in series between the virtual ground line 14 associated with bit line BL1 and the actual source 12 of ground potential. (In the depicted embodiment, transistor 20 is an n-channel transistor which is off when its gate is low.) The gate of transistor 20 is connected to ABL1. Because the voltage of ABL1 is designed to be always higher than the threshold voltage of an n-channel transistor, transistor 20 is therefore on at all times. However, as the voltage on BL1 comes closer to ground and therefore the voltage on ABL1 also falls correspondingly, transistor 20 becomes less conducting. This prevents the voltage on BL1 from dropping excessively low even when large numbers of EPROMs 10 are conducting. THis in turn improves the switching speed of the device when all of EPROMs 10 turn off because the voltage on BL1 does not have to be pulled up so far to reach the threshold for logic 1.

Another aspect of the invention involves the provision of two transistors 30 and 32 connected in parallel with one another between reference potential source VCC and ABL1. (In the depicted embodiment, each of transistors 30 and 32 is a p-channel transistor which is off when its gate is high.) The gate of transistor 30 is connected to ABL1, while the gate of transistor 32 is connected to FBL1. Transistor 30 is preferably a relatively small device which is on at all times providing a relatively small "leakage" current from VCC to ABL1. Ideally, the logic 1 state of ABL1 should be biased close to the trip-point of the subsequent inverter stage 18a. In this embodiment, the logic 1 state of ABL1 is limited to VCC minus Vtp (where Vtp is the threshold voltage of p-channel transistor 30). Transistor 32, on the other hand, is preferably a relatively large device which is on only when ABL1 is logic 0. Thus when all of EPROMs 10 turn off, the relatively large current flowing through transistor 32 is available to help rapidly pull up ABL1 from logic 0 to logic 1. On the other hand, as soon as ABL1 reaches logic 1, transistor 32 shuts off so that it does not retard a subsequent transition from logic 1 to logic 0.

The difference in voltage on ABL1 between the logic states and the trip point of inverter state 18a determines the noise immunity of the sense amplifier stage. In this embodiment, inverter 18a is designed with its trip point at about one-half VCC or 2.5 volts. For logic 1, the noise margin is therefore calculated to be 0.5 VCC minus Vtp. For logic 0, ABL1's voltage is determined by the ratio of the combined currents through pull-up transistors 30 and 32 versus the current through the EPROM cell 10 and current limiting device 20. As mentioned above, the logic 0 state of ABL1 is about 1.2 volts. Therefore, the noise margin for logic 0 is calculated to be 0.5 VCC minus 1.2 volts. Because Vtp is typically about 1 volt, the noise margins for both logic states are similar.

It will be understood that the foregoing is merely illustrative of the principles of this invention, and that various modifications can be made by those skilled in the art without departing from the scope and spirit of the invention. For example, although particualr voltage values and device types (e.g., n-channel or p-channel transistors) have been mentioned, it will be understood that other voltages and devices can be used if desired. Thus transistor 30 could be an n-channel transistor with its gate tied to VCC. With this configuration, the logic state of ABL1 is limited to VCC minus Vtn (where Vtn is the threshold voltage of n-channel transistor 30).

We claim:

1. A programmable logic device comprising:

a bit line conductor;

a source of ground electrical potential;

a virtual ground line conductor;

a plurality of word line conductors, each of which conducts an associated word line signal;

a plurality of programmable interconnection devices, each of which, if programmed, is controlled by the word line signal on a respective one of said word line conductors to selectively connect said bit line conductor to said virtual ground line conductor; and variable current limiting means connected in series between said virtual ground line conductor and said source of ground electrical potential, said variable current limiting means being means responsive to the voltage of the signal on said bit line conductor so that said variable current limiting means becomes less conductive and conducts less current between said virtual ground line conductor and said source of ground electrical potential as the voltage of the signal on said bit line conductor approaches said ground electrical potential.

2. The device defined in calim 1 further comprising:

a source of a reference electrical potential having a voltage which is different from the voltage of said ground electrical potential;

first means connected between said bit line conductor and said source of a reference electrical potential for conveying a first current between said bit line conductor and said source of a reference electrical potential at all times and;

second means connected between said bit line conductor and said source of a reference electrical potential for selectively conveying a second current between said bit line conductor and said source of a reference electrical potential, said second means being responsive to the electrical potential on said bit line conductor so that said second means conveys said second current between said bit line conductor and said source of a reference electrical potential substantially only when the electrical potential on said bit line conductor is closer to said ground electrical potential that to said reference electrical potential.

3. The device defined in claim 2 wherein said second current is larger than said first current.

4. In a programmable logic device having a source of a reference electrical potential, a bit line conductor, and a plurality of word line conductors, each of said word line conductors being programmably interconnectable to said bit line conductor via an interconnection device connected between said bit line conductor and a virtual ground line conductor which conducts current to or from a source of ground electrical potential which has a voltage different from the voltage of said reference electrical potential, the improvement comprising:

first means connected between said bit line conductor and said source of a reference electrical potential for conveying a first current between said bit line conductor and said source of a reference electrical potential at all times; and second means connected between said bit line conductor and said source of a reference electrical potential for selectively conveying a second current between said bit line condictor and said source of a reference electrical potential, said second means being responsive to the electrical potential on said bit line conductor so that said second means conducts said second current between said bit line conductor and said source of a reference electrical potential substantially only when the electrical potential on said bit line conductor is closer to said ground electrical potential than to said reference electrical potential.

5. The device defined in claim 4 wherein said second current is larger than said first current.

6. The device defined in claim 4 further comprising:

sense amplifier means connected to said bit line conductor for sensing and amplifying the electrical potential on said bit line conductor to produce a final bit line output signal; and means for biasing the electrical potential on said bit line conductor so that said electrical potential is just above the trip point of said sense amplifier means when said electrical potential is closer to said reference electrical potential than to said ground electrical potential.

7. The method of operating a programmable logic device having a bit line conductor and a plurality of word line conductors, each of said word line conductors being programmably interconnectable to said bit line conductor via an interconnection device connected between said bit line conductor and a virtual ground line conductor which conducts current to or from a source of ground electrical potential, said method comprising the steps of:

connecting variable current limiting means in series between said virtual ground line conductor and said source of ground electrical potential; and controlling said variable current limiting means in response to the voltage of the signal on said bit line conductor so that said variable current limiting means becomes less conductive as the voltage of the signal on said bit line conductor approaches said ground electrical potential.

8. The method defined in claim 7 wherein said programmable logic device has a source of a reference electrical potential having a voltage which is different from the voltage of said ground electrical potential, and wherein said method further comprises the steps of:

conveying a first current between said bit line conductor and said source of a reference electrical potential; and conveying a second current between said bit line conductor and said source of a reference electrical potential substantially only when the electrical potential on said bit line conductor is closer to said ground electrical potential than to said reference electrical potential.

9. The method defined in claim 8 wherein said second current is larger than said first current.

10. The method of operating a programmable logic device having a source of a reference electrical potential, a bit line conductor, and a plurality of word line conductors, each of said word line conductors being programmably interconnectable to said bit line conductor via an interconnection device connected between said bit line conductor and a virtual ground line conductor which conducts current to or from a source of ground electrical potential which has a voltage different from the voltage of said reference electrical potential, said method comprising the steps of:

conveying a first current between said bit line conductor and said source of a refernce electrical potential; and conveying a second current between said bit line conductor and said source of a reference electrical potential substantially only when the electrical potential on said bit line conductor is closer to said ground electrical potential than to said reference electrical potential.

11. The method defined in claim 10 wherein said second current is larger than said first current.

12. The method defined in claim 10 wherein said programmable logic device has sense amplifier means connected to said bit line conductor for sensing and amplifying the electrical potential on said bit line conductor to produce a final bit line signal, and wherein said method further comprises the step of:

biasing the electrical potential on said bit line conductor so that said electrical potential is just above the trip point of said sense amplifier means when said electrical potential is closer to said reference electrical potential than to said ground electrical potential.

* * * * *